(12) United States Patent
Hickman

(10) Patent No.: US 10,559,173 B2
(45) Date of Patent: Feb. 11, 2020

(54) NON-CONTACT VOLTAGE DETECTOR

(71) Applicant: James Hickman, Belleville, IL (US)

(72) Inventor: James Hickman, Belleville, IL (US)

( * ) Notice: Subject to any disclaimer, the term of this patent is extended or adjusted under 35 U.S.C. 154(b) by 0 days.

(21) Appl. No.: 15/067,755

(22) Filed: Mar. 11, 2016

(65) Prior Publication Data

US 2016/0267754 A1 Sep. 15, 2016

Related U.S. Application Data

(60) Provisional application No. 62/131,306, filed on Mar. 11, 2015.

(51) Int. Cl.
| | |
|---|---|
| *G08B 1/00* | (2006.01) |
| *G08B 5/36* | (2006.01) |
| *H02J 7/00* | (2006.01) |
| *G01R 1/07* | (2006.01) |
| *G01R 19/155* | (2006.01) |
| *G08B 21/18* | (2006.01) |
| *G08B 3/10* | (2006.01) |
| *G01R 1/067* | (2006.01) |

(52) U.S. Cl.
CPC ............... *G08B 5/36* (2013.01); *G01R 1/07* (2013.01); *G01R 19/155* (2013.01); *H02J 7/0047* (2013.01); *G01R 1/06788* (2013.01); *G08B 3/10* (2013.01); *G08B 21/182* (2013.01); *H02J 2007/0049* (2013.01)

(58) Field of Classification Search
CPC .......... G08B 5/36; G08B 3/10; G08B 21/182; G01R 1/07; G01R 19/155; G01R 1/06788; H02J 7/0047; H02J 7/007; H02J 2007/0049

USPC ........ 340/532, 660, 654, 657; 324/149, 133, 324/72.5

See application file for complete search history.

(56) References Cited

U.S. PATENT DOCUMENTS

| | | | | |
|---|---|---|---|---|
| 5,075,620 A | * | 12/1991 | Shaw | ............ G01R 19/257 324/122 |
| 5,672,964 A | | 9/1997 | Vinci | |
| 5,877,618 A | | 3/1999 | Luebke et al. | |
| 5,952,820 A | * | 9/1999 | Thrasher | ............ G01R 19/155 324/119 |
| 6,424,139 B2 | * | 7/2002 | Bystrom | ............ G01R 1/06788 324/133 |

(Continued)

*Primary Examiner* — Anh V La
(74) *Attorney, Agent, or Firm* — Adam Bagwell

(57) ABSTRACT

A non-contact voltage detector for detecting and indicating voltage. The non-contact voltage detector includes a housing having a voltage detection probe and plurality of light sources. The housing further includes an integral power source that is rechargeable via an external power source coupled to a user input port. The power source provides electrical energy to the non-contact voltage detector that further includes a controller and control circuit that is operably connected to at least one light source. The controller and control circuit can detect electrical energy at the user input port, detect the charge state of the integral power source, charge the integral power source, and emit one or more charge state light indicators when the state of the integral power source changes. In addition, the light sources can indicate the presence of voltage at the probe and can be independently activated by one or more switches.

15 Claims, 6 Drawing Sheets

(56) References Cited

U.S. PATENT DOCUMENTS

| | | | |
|---|---|---|---|
| 6,812,685 B2 * | 11/2004 | Steber | G01R 1/06788 |
| | | | 324/115 |
| 6,828,767 B2 | 12/2004 | Douglas | |
| 7,733,078 B2 * | 6/2010 | Duke | G01R 31/315 |
| | | | 324/72.5 |
| 8,193,802 B2 | 6/2012 | Jones et al. | |
| 8,786,447 B1 * | 7/2014 | Wise | G01R 29/0857 |
| | | | 340/573.4 |
| 2001/0001537 A1 * | 5/2001 | McNulty | G01R 1/06777 |
| | | | 324/72.5 |
| 2011/0169481 A1 * | 7/2011 | Nguyen | H01M 2/1055 |
| | | | 324/126 |
| 2014/0035557 A1 * | 2/2014 | Lamoreux | G01R 19/155 |
| | | | 324/72.5 |
| 2014/0240967 A1 * | 8/2014 | Sharrah | F21L 4/08 |
| | | | 362/183 |

* cited by examiner

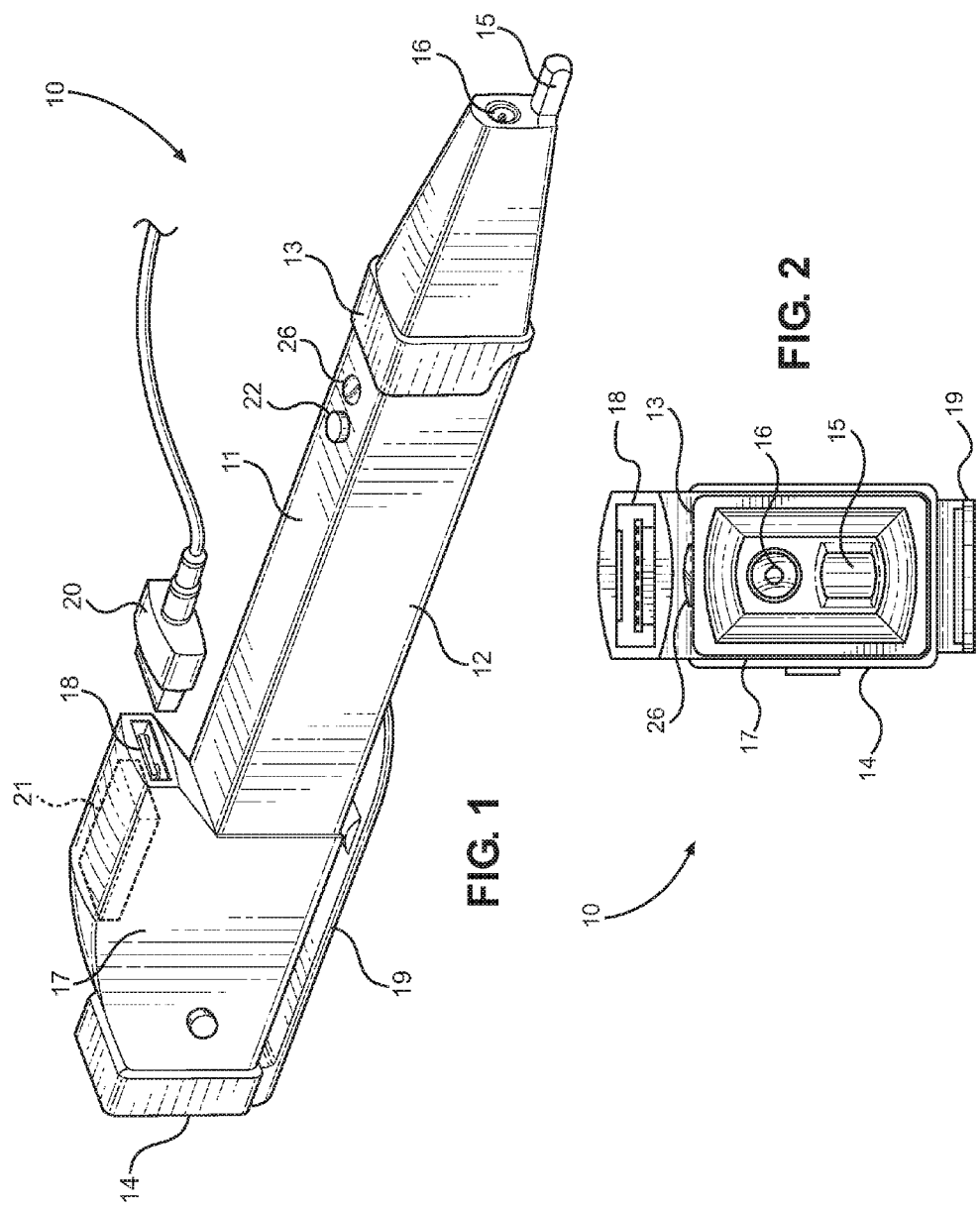

NON-CONTACT VOLTAGE DETECTOR

CROSS REFERENCE TO RELATED APPLICATION

This application claims the benefit of U.S. Provisional Application No. 62/131,306 filed on Mar. 11, 2015. The above identified patent application is herein incorporated by reference in its entirety to provide continuity of disclosure.

BACKGROUND OF THE INVENTION

The present invention relates to a voltage detector devices. More specifically, the present invention relates to a non-contact voltage detector with integral power source operably connected to a user input port.

Many attempts have been made to provide a non-contact voltage detector that detects the presence of voltage in electrical components and devices. Typically, these devices detect voltage in electrical components by detecting magnetic and electric fields caused by the presence of electrical energy. These devices offer protection for any person who may come in contact with electrical components and desires to safely determine if the electrical components are energized or not. However, standard voltage detectors, for example, do not allow for the recharging of their power source (battery) without removal from a battery compartment.

Non-contact voltage detectors are used as a safety device to minimize the risk of being electrocuted. Testing these known devices, however, may be difficult given that many electrical components and devices that require testing for the presence of voltage are in inaccessible locations. For example, an electrician wanting to detect the presence of voltage at an electrical outlet in a crawl space would, upon determining that the batteries are dead, be required to removable one or more batteries from a non-contact voltage detector and replace them with additional batteries.

U.S. Pat. No. 8,193,802 to Evans describes a slidably attachable non-contact voltage detector. However, Evans has several known drawbacks. In particular, Evans requires the removal of batteries from the housing of the non-contact voltage detector. However, the removal and insertion of batteries may be exceedingly difficult in low light or no light conditions, and in areas with mobility constraints, such as attics and crawl spaces. The present invention provides for non-contact voltage detector with integral power source rechargeable via electrical connection to an external power source using an electrical connector, such as a USB connector. Further, dead batteries do not allow for the testing of outlets and circuits, requiring the batteries to be replaced with charged batteries or removed and recharged in an external battery charging station. The present invention allows a user to recharge an integral power source from an external electrical power source immediately prior to using the present invention. Additionally, the present invention includes a plurality of light sources that are configured to flash continuously or a predetermined number of times when the power source is being charged via the user input port. Further, at least one of the light sources of the present invention is operably connected to the integral power source and configured to emit a plurality of charge state light indicators, wherein a first charge state light indicator will indicate a first charge state of the integral power source, and a second charge state light indicator will indicate a second charge state of the integral power source.

In light of the devices disclosed in the prior art, it is submitted that the present invention substantially diverges in design elements from the prior art and consequently it is clear that there is a need in the art for an improvement to existing non-contact voltage detector devices. In this regard the instant invention substantially fulfills these needs.

SUMMARY OF THE INVENTION

In view of the foregoing disadvantages inherent in the known types of non-contact voltage detectors now present in the prior art, the present invention provides a non-contact voltage detector wherein the same can be utilized for detecting and indicating voltage present in electrical devices, outlets, and wires.

It is therefore an object of the present invention to provide a new and improved non-contact voltage detector that has all of the advantages of the prior art and none of the disadvantages.

The present invention relates to a non-contact voltage detector comprising a housing having an first end and a second end, wherein the first end includes a probe and a first light and the second end includes an integral, rechargeable power source.

It is therefore an object of the present invention to provide a non-contact voltage detector that detects and indicates voltage present in electrical devices, outlets, and wires.

It is therefore an object of the present invention to provide a housing comprising a power source compartment having an electrical connector operably connected to the rechargeable power source disposed within the power source compartment.

It is therefore an object of the present invention to provide a non-contact voltage detector comprising a housing having at least a first and second switch that are independently actuatable and operably connected to a first and second light source. This allows a user to select which light source is activated independently of the other.

It is another object of the present invention to provide a non-contact voltage detector that is configured to detect external electrical energy at the user input port, detect a charge state of the integral power source, and charge the integral power source from the external electrical power source at the user input port.

It is another object of the present invention to provide a non-contact voltage detector that is configured to monitoring the charge state of the integral power source, and if the charge state of the integral power source is fully charged, then activate at least one indicator, or if the charge state of the integral power source is not fully charged, then continue charging the integral power source from the external electrical power source.

Other objects, features and advantages of the present invention will become apparent from the following detailed description taken in conjunction with the accompanying drawings.

BRIEF DESCRIPTIONS OF THE DRAWINGS

Although the characteristic features of this invention will be particularly pointed out in the claims, the invention itself and manner in which it may be made and used may be better understood after a review of the following description, taken in connection with the accompanying drawings wherein like numeral annotations are provided throughout.

FIG. 1 shows a perspective view of one embodiment of the present invention.

FIG. 2 shows a front end view of one embodiment of the present invention.

DETAILED DESCRIPTION OF THE INVENTION

Figure 3:
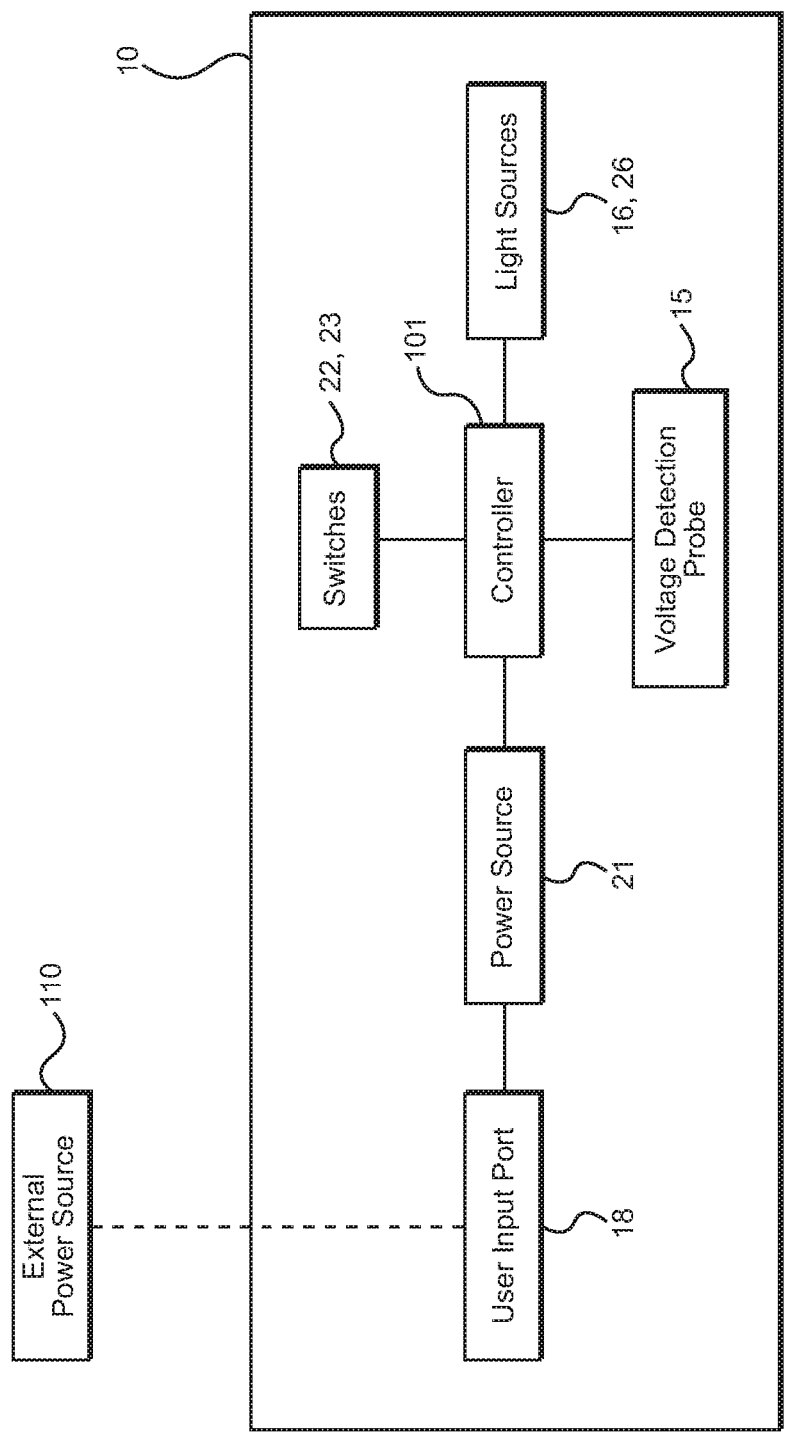
FIG. 3 shows a block diagram of one embodiment of the present invention.

Reference is made herein to the attached drawings. Like reference numerals are used throughout the drawings to depict like or similar elements of the non-contact voltage detector. For the purposes of presenting a brief and clear description of the present invention, the preferred embodiment will be discussed as used for detecting and indicating voltage present in electrical devices, outlets, and wires. The figures are intended for representative purposes only and should not be considered to be limiting in any respect.

As used herein, "logic" refers to (i) logic implemented as computer instructions and/or within one or more computer processes and/or (ii) logic implemented in electronic circuitry. As used herein, "computer-readable medium" excludes any transitory signals, but includes any non-transitory data storage circuitry, e.g., buffer cache, and queues, within transceivers of transitory signals. In the interest of economy, the present disclosure refers to "computer-readable medium," "a processor," "a database," and so on. However, this should not be read as limiting in any way as the present disclosure contemplates embodiments of the present invention utilizing "one or more computer-readable media," "one or more processors," "one or more databases," and so on. Unless specifically limited to a single unit, "a" is intended to be equivalent to "one or more" throughout the present disclosure.

Referring now to FIGS. 1 and 2, there is a perspective view of one embodiment of the present invention and a front end view of one embodiment of the present invention, respectively. The present invention provides a non-contact voltage detector 10 comprising an elongated housing 11 having a middle portion 12 positioned between a first end 13 and a second opposing end 14, wherein the first end 13 further comprises an electrical/voltage detection probe 15 and one or more light sources, wherein one or more light sources includes a first light source 16 and a second light 26. The detection probe 15 is configured to be positioned in close proximity to an external electrical object/component, such as an outlet, wire, or other component, and detect voltages without contacting the electrical component. In the shown embodiment, the housing 11 has a tubular shape having a square cross sectional area. However, the housing 11 may have any suitable shape. A second light source 26 is disposed on the housing 11 and is operably connected to the power source 21 and is configured to indicate the presence or absence of voltage from energized external electrical objects.

A power source compartment 17 is disposed on the housing 11 and is in electronic communication with an user input port 18. In the shown embodiment, the power source compartment 17 is disposed towards the second end 12 of the housing 11. The power source compartment 17 is configured to house a power source 21, such as a battery 21, that provides electrical power to the first and second light sources 16, 26 and the electrical detection probe 15. In the shown embodiment, the user input port 18 is a USB electrical connector, however any electrical connector may be utilized to provide electrical power to the power source 21 disposed within the power source compartment 17.

The housing 11 is configured to be handled by a hand of a user, allowing a user to position the electrical/voltage detection probe 15. In the shown embodiment, a clip 19 is disposed towards the second end of the housing 11. The clip 19 is configured to be removably attached to a person or object, such as a pocket. The clip 19 allows a user to carry the non-contact voltage detector 10 hands-free, enabling a user to climb a ladder or otherwise utilize their hands for other tasks. As shown, the clip 19 is positioned on the opposing side of the housing 11 from the power source compartment 17.

In one embodiment, the non-contact voltage detector 10 further comprises volt sense circuitry for detecting a voltage at the electrical/voltage detection probe 15. In the shown embodiment, the probe 15 includes a generally flat tab with a rounded distal end configured to be placed within a close proximity to an electrical component, such as an electrical outlet or wire. In alternative embodiments, the probe 15 may suitable shape or dimension, or may be positioned partially or wholly within the housing 11. The probe 15 is operably connected configured to send a signal to the second light source 26 indicating the presence or absence of voltage at the probe 15. The probe 15 may include a magnetic induction assembly, a capacitive coupling assembly, or the like. The non-contact detection probe 15 is operable to detect AC and DC voltages in a wide range. In an alternative embodiment, non-contact detection probe 15 may detect AC voltages in the range of for example, 50V-1000V.

In the shown embodiment, a non-contact voltage detector 10 comprises a first switch 22 and a second switch 23 disposed on the housing 11, wherein the first switch 22 is positioned towards the first end 13 of the housing 11 and is operably connected to the first and second light source 16, 26. In the shown embodiment, the first switch 22 is an actuatable button that activates and deactivates the first and second light source 16, 26 when depressed. The second switch 23 is disposed towards the second end 14 of the housing 11 and is operably connected to at least one of the first light source 16 and the second light source 26. In one embodiment, the second switch 23 is operably connected to the first light source 16 only. In this way, the first light source 16 may be independently operated as desired. In the shown embodiment, the first light source 16 is a LED flashlight, wherein the end of the first light source 16 is generally flush with the exposed first end 13 of the housing 11. In this way, the first light source 16 is configured to illuminate the area in front of the non-contact detection probe 15, while not interfering with the operation thereof. In another embodiment, the first switch 22 is a tester switch that indicates to the user that the power source has sufficient charge to effectively detect and indicate the presence of voltage at the probe 15.

Referring now to FIG. 3, there is a block diagram of one embodiment of the present invention. The non-contact voltage detector 10 comprises a controller 101, a power source 21, a user input port 18, one or more switches 22, 23, a voltage detection probe 15, and a plurality of light sources 16, 26. In one embodiment, the controller 101 provides operational control of the first light source 16 that is configured to activate upon detection of voltage by the voltage detection probe 15. In the shown embodiment, the power source 21 provides electrical energy to the controller 101, the voltage detection probe 15, the first light source 16, and the second light source 26. The power source 21 may include an integral battery positioned with the power source compartment (not shown) that is rechargeable via an external power source 110 coupled via electrical connector at the user input port 18.

In one embodiment, the first switch 22 is configured to activate or deactivate the non-contact voltage detector 10 by controlling the supply of electrical power thereto. In the shown embodiment, electrical power is selectively supplied to the controller 101 by actuating the first switch 22. However, in other embodiments the power source 21 is always connected to the voltage sensing circuit, and the user does not need to activate the first switch 22 before using the non-contact voltage detector 10.

In one use, when the first switch 22 is actuated the non-contact voltage detector 10 is turned "on," and the first light source 16 is illuminated, such that the user is provided with a continuous visual indication of the operability of the non-contact voltage detector 10. In this embodiment for example, if the power source 21 within the non-contact voltage detector 10 is depleted and the voltage sense circuit is not receiving electrical power, the user is unable to detect the presence of a voltage. As a result of the first light source 16 being illuminated when the voltage sense circuit is powered (i.e., the non-contact voltage detector 10 is "on"), the user receives a continuous indication of the charge state of the power source (e.g., whether the battery is depleted or fully charged).

Figure 4:
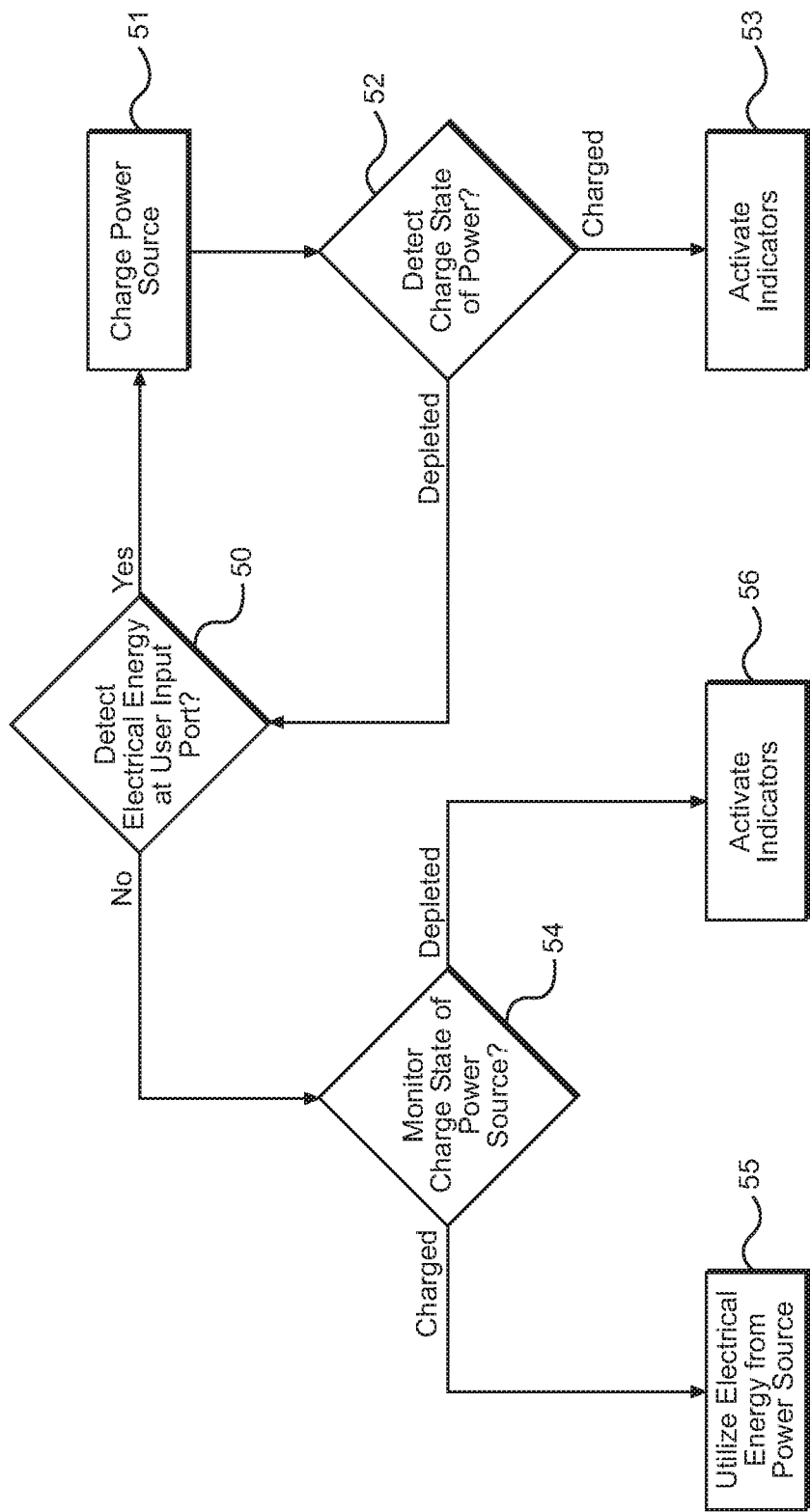
FIG. 4 shows a flowchart of an embodiment of a method of the present invention.

Referring now to FIG. 4, there is shown a flowchart of an embodiment of a method of the present invention. In the shown embodiment of a method of the present invention, the non-contact voltage detector utilizes a charging system that is configured to charge an integral power source. The present invention includes a controller (not shown) having logic stored on a computer-readably medium that, when executed by a processor of the present invention, causes the non-contact voltage detector to perform a number of steps including detecting external electrical at the user input port 50, charging the power source 51, detecting the charge state of the power source 52, and indicating at least one of the charge states 53.

Upon detecting external electrical at the user input port 50, the power source is charged 51 and the charge state of the power source is periodically detected 52 and monitored. If the charge state of the power source is "charged", then the non-contact voltage detector activates indicators 53. In one embodiment, the indicators 53 include the first light source and the second light source to create a visual indicator, and the speaker to create an audible indicator. In yet another embodiment, the first light source or second light source is configured to flash continuously or a predetermined number of times when the power source is being charged via the user input port, and when the power source has been fully charged from an external electrical power source.

The present invention further includes logic stored on a computer-readably medium that, when executed by a processor of the present invention, causes the non-contact voltage detector 10 to perform a number of steps including monitoring the charge state of the power source 54, utilizing electrical energy of the power source 54, and indicating at least one of the charge states 56.

In one embodiment, the first light source is configured to flash continuously or a predetermined number of times when the power source is below a predetermined threshold value.

In some embodiments, the non-contact voltage detector is configured to flash a predetermined number of times or remain illuminated for a predetermined period of time after the charge state of the power source becomes depleted to provide the user with an indication of the operability of the non-contact voltage detector. Further, when the power source is charged, the user may be provided with a visual or audible indication that the power source is not depleted and that the voltage sense circuit is operable.

Figure 5:
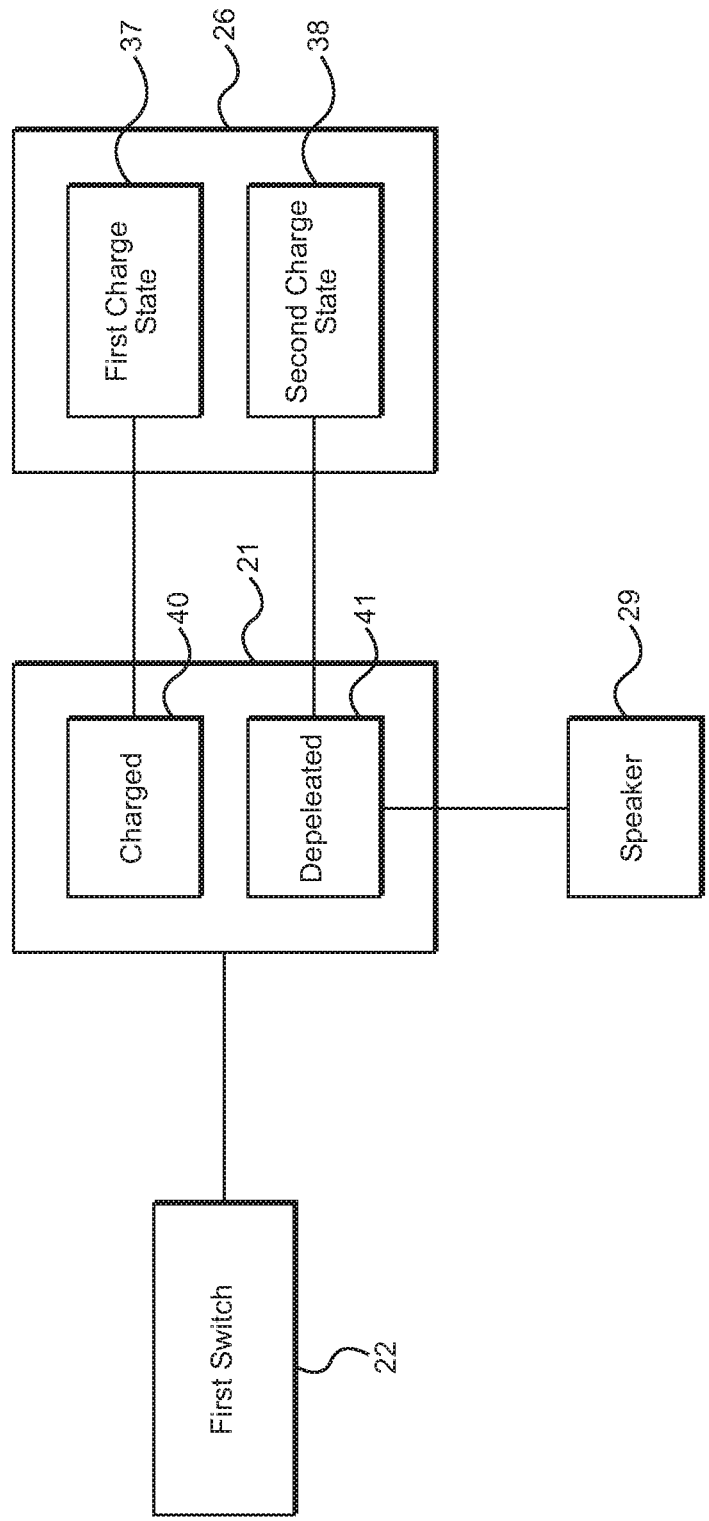
FIG. 5 shows another flowchart of an embodiment of a method of the present invention.

Referring now to FIG. 5, there is shown another flowchart of an embodiment of a method of the present invention. In the shown embodiment, the first switch 22 is operably connected to the power source 21, wherein the power source 21 is configured to detect a charge state of the power source 21 and the second light source 26 is configured to emit a plurality of charge state light indicators 37, 38, wherein a first charge state light indicator 37 will indicate a first charge state 40 of the integral power source, and a second charge state light indicator 38 will indicate a second charge state 41 of the integral power source.

In the shown embodiment, the charge state of the power source 21 includes charged state 40 and depleted state 41, wherein the depleted state 41 would be considered a power level insufficient to detect a voltage at the probe 15 or to indicate such a voltage at the second light source 26. The charged state 40 would include a power level sufficient to detect a voltage at the probe 15 or to indicate such a voltage at the second light source 26. However in other embodiments, the range of charged state 40 and depleted state 41 may be reconfigured to account for safety.

If a charged state 40 is detected, then the second light source 26 will emit a first power source charge state indicator 37. In one embodiment, the first power source charge state indicator 37 is a green light that indicates to the user that the power source 21 is ready for use. In other embodiments, the first power source charge state indicator 37 can include any visual or auditory signal.

If a depleted state 41 is detected, then the second light source 26 will emit a second power source charge state indicator 38. In one embodiment, the second power source charge state indicator 38 is a red light that indicates to the user that the power source 21 is not ready for use. In other embodiments, the second power source charge state indicator 38 can include any visual or auditory signal. In the shown embodiment, if a depleted state 41 is detected, then a speaker 29 will emit an audible sound.

Figure 6:
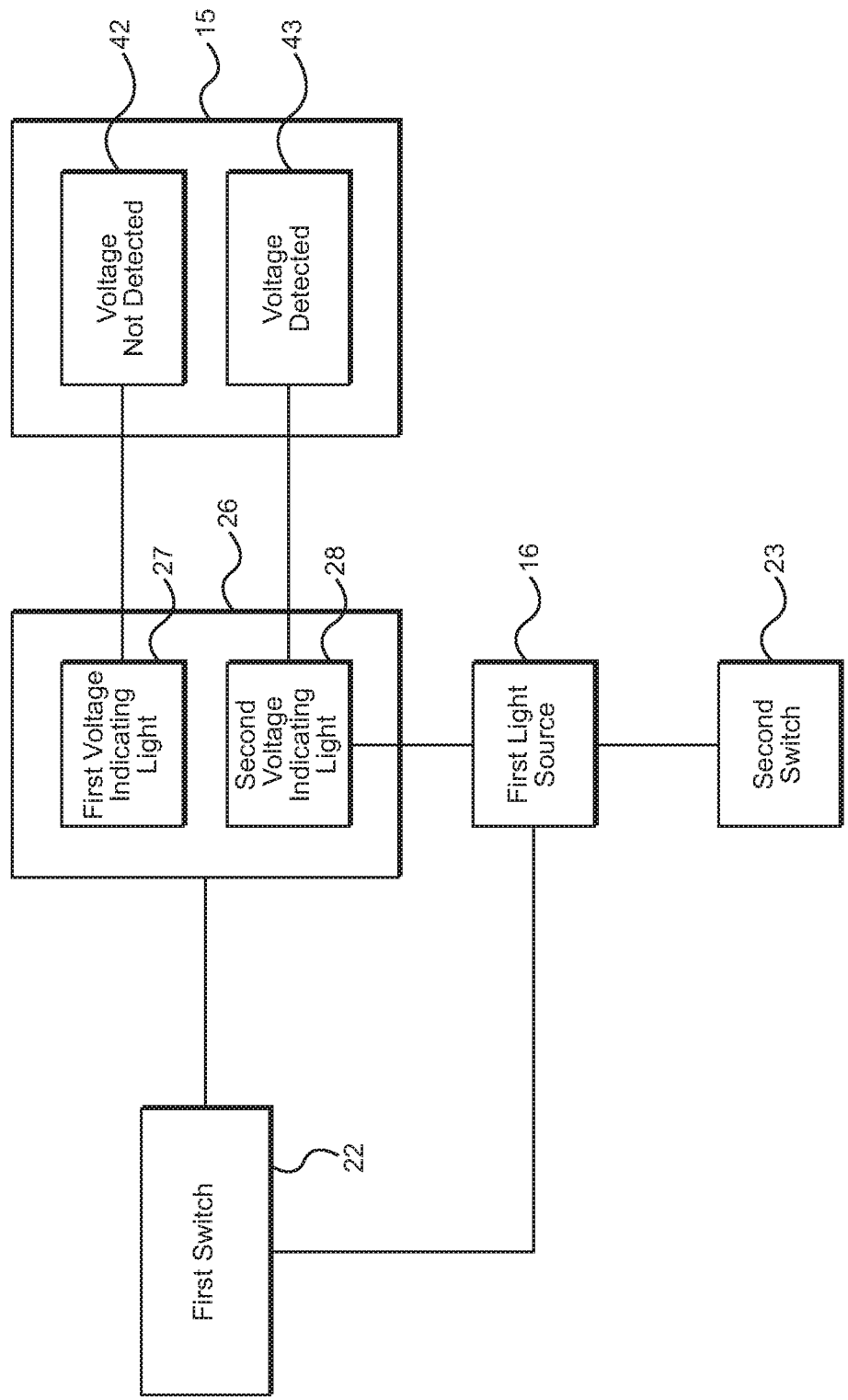
FIG. 6 shows another flowchart of an embodiment of a method of the present invention.

Referring now to FIG. 6, there is another flowchart of an embodiment of a method of the present invention. In the shown embodiment, the first switch 22 is operably connected to second light source 26 and the first light source 16. The second light source 26 is configured to emit a plurality of voltage light indicators, wherein a first voltage light indicator 27 will indicate a first voltage state 42 detected by the probe, and a second voltage light indicator 28 will indicate a second voltage state 43 detected by the probe. In one embodiment, the first voltage state 42 is a voltage below a certain level, such as less than 10 Volts. The second voltage state 43 is a voltage above or equal to a certain level detected by the probe 15, such as 10 Volts. However in other embodiments, the range of voltage states 42, 43 may be reconfigured as desired.

If a voltage below a certain level 42 is detected, then the second light source 26 will emit a first voltage light indicator 27. In one embodiment, the first voltage light indicator 27 is a green light. In other embodiments, the first voltage light indicator 27 can include any visual or auditory signal. If a voltage above or equal 43 to a certain level, then the second light source 26 will emit a second voltage light indicator 28. In one embodiment, the second voltage light indicator 28 is a red light.

Figure 7:
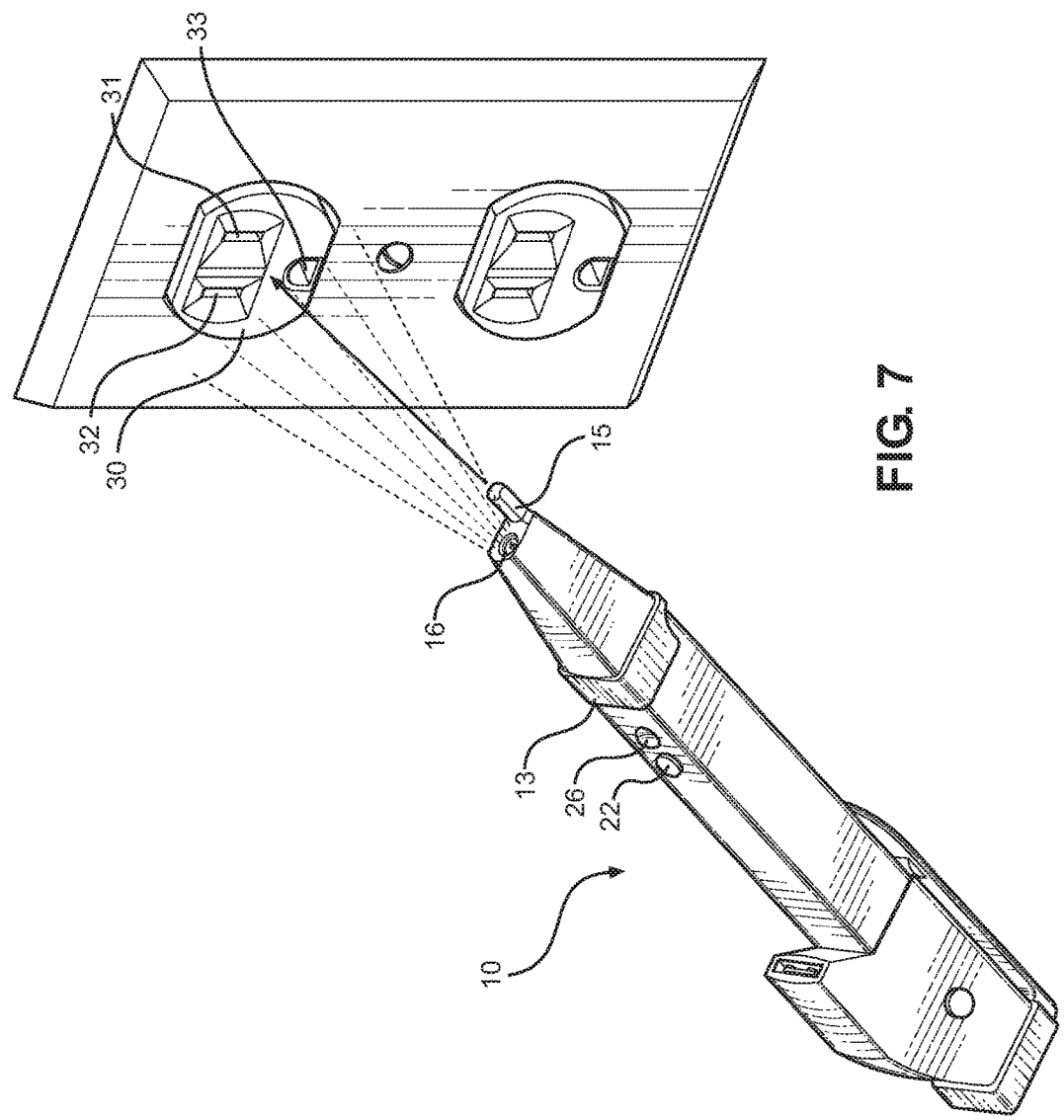
FIG. 7 shows a perspective view of one embodiment of the one use of the present invention.

Referring now to FIG. 7, there is a shown perspective view of one embodiment of the one use of the present invention. In one use, a user, such as an electrician, would connect an electrical connector that is in turn in electronic communication with an external power source, to charge the power source of the non-contact voltage detector 10. In some embodiments, at least one of the light sources 16, 26 will indicate the charged state of the power source of the non-contact voltage detector 10. Further, the first switch 22 may also be used to test the charged state of the power source of the non-contact voltage detector 10. Once charged, the non-contact voltage detector 10 may be used to determine the presence or absence of voltage in electrical devices and components.

In the shown embodiment, the non-contact voltage detector 10 is in close proximity to an electrical outlet 30 having at least one hot connection 31. The electrical outlet 30 may also comprises a neutral connection 32 and a ground connection 33 that would not possess voltage. When the probe 15 moves within a certain proximity, such as within an inch, to an energized hot connection 31, then the presences of voltage in the hot connection 31 causes at least one of the light sources 16, 26 of the non-contact voltage detector 10 to become illuminated, flash, alter color, or otherwise indicate the presence of voltage by indicating as such.

I claim:

1. A non-contact high voltage detector comprising:
   an elongated housing having a first end and a second end;
   a probe attached to and extending from the first end of the housing, wherein the probe is configured to detect high voltage in an external object;
   an electrical connector, said electrical connector positioned within an opening in the elongated housing;
   an integral power source disposed within a power source compartment, wherein the power source is rechargeable and operably connected to the electrical connector;
   a controller disposed within the housing and operably connected to the probe and the integral power source;
   one or more light sources;
   wherein said one or more light sources are operably connected to the integral power source and controller, wherein the controller selectively illuminates the one or more light sources when the probe detects said high voltage in the external object.

2. The non-contact high voltage detector of claim 1, wherein one or more light sources disposed on the housing that are configured to indicate a charge state of the integral power source.

3. The non-contact high voltage detector of claim 1, wherein the electrical connector is a USB port.

4. The non-contact high voltage detector of claim 1, wherein the second end of the housing further comprises a clip configured to removably secure the housing to a pocket.

5. The non-contact high voltage detector of claim 1, wherein:
   a first switch is operably connected to one or more light sources, wherein one or more light sources includes a first light source and a second light source.

6. The non-contact high voltage detector of claim 5, wherein a second switch is operably connected to at least one of the first light source and the second light source.

7. The non-contact high voltage detector of claim 1, wherein:
   the second light source is operably connected to the power source and configured to emit a plurality of charge state light indicators, wherein a first charge state light indicator will indicate a first charge state of the integral power source, and a second charge state light indicator will indicate a second charge state of the integral power source.

8. The non-contact high voltage detector of claim 1, wherein:
   a second light source is operably connected to the probe and configured to emit a plurality of voltage light indicators, wherein a first voltage light indicator will indicate a first voltage state detected by the probe, and a second voltage light indicator will indicate a second voltage state detected by the probe.

9. The non-contact high voltage detector of claim 1, wherein: the first light source comprises an exposed end, wherein the exposed end is substantially flush with the first end of the housing.

10. The non-contact high voltage detector of claim 1, wherein the controller comprises circuitry for detecting a voltage at the probe and indicating a voltage by emitting a light at least at one of the first light source and the second light source.

11. The non-contact high voltage detector of claim 1, wherein said high voltage comprises a voltage exceeding 600 V.

12. A method of charging and powering a non-contact high voltage detector, comprising the steps of:
   utilizing the non-contact high voltage detector comprising a housing, a light source and a probe configured to detect high voltage;
   detecting external electrical energy at a user input port positioned within an opening of the housing;
   detecting a charge state of an integral power source, said integral power source being electrically connected to the user input port;
   charging the integral power source from the external electrical energy at the user input port.

13. The method of charging and powering a non-contact high voltage detector of claim 12, further comprising the steps of:
   monitoring the charge state of the integral power source;
   if the charge state of the integral power source is fully charged, then activate at least one indicator; if the charge state of the integral power source is not fully charged, then continue charging the integral power source from the external electrical.

14. The method of charging and powering a non-contact high voltage detector of claim 13, wherein at least one indicator comprises activating at least one of the light source and a speaker configured to produce audible sound.

15. The method of charging and powering a non-contact high voltage detector of claim 12, wherein said high voltage comprises a voltage exceeding 600 V.

* * * * *